(12) United States Patent
Jäger

(10) Patent No.: US 11,824,147 B2
(45) Date of Patent: *Nov. 21, 2023

(54) COMPONENT WITH AN OPTOELECTRONIC PART

(71) Applicant: OSRAM OLED GmbH, Regensburg (DE)

(72) Inventor: Claus Jäger, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 216 days.

This patent is subject to a terminal disclaimer.

(21) Appl. No.: 17/405,906

(22) Filed: Aug. 18, 2021

(65) Prior Publication Data

US 2021/0376206 A1 Dec. 2, 2021

Related U.S. Application Data

(62) Division of application No. 16/349,243, filed as application No. PCT/EP2017/080227 on Nov. 23, 2017, now Pat. No. 11,165,004.

(30) Foreign Application Priority Data

Nov. 25, 2016 (DE) .......................... 102016122770.6

(51) Int. Cl.
*H01L 33/58* (2010.01)
*H01L 33/60* (2010.01)
(Continued)

(52) U.S. Cl.
CPC .......... *H01L 33/60* (2013.01); *G02B 19/0028* (2013.01); *G02B 19/0052* (2013.01);
(Continued)

(58) Field of Classification Search
CPC ................................ H01L 33/58; H01L 33/60
See application file for complete search history.

(56) References Cited

U.S. PATENT DOCUMENTS 7,066,626 B2 6/2006 Omata
7,581,860 B2 9/2009 Bogner et al.
(Continued)

FOREIGN PATENT DOCUMENTS

CN 1538538 A 10/2004
DE 102014116687 A1 5/2016
(Continued)

OTHER PUBLICATIONS

KIPO machine translation of Kim (KR20090119248) (Year: 2009).*

*Primary Examiner* — Christopher A Johnson
(74) *Attorney, Agent, or Firm* — Slater Matsil, LLP

(57) ABSTRACT

In an embodiment a component includes a carrier, at least one optoelectronic part arranged on the carrier, the optoelectronic part configured to emit electromagnetic radiation, a frame arranged on the carrier and enclosing a part space, wherein the optoelectronic part is arranged in the part space, and wherein the frame comprises a reflector, and a lens arranged on the frame and at least partially covering an opening of the part space, wherein the reflector is configured to direct the electromagnetic radiation onto the lens, wherein the lens is configured to direct the electromagnetic radiation of the optoelectronic part, and wherein the lens comprises at least a partial pyramidal-shaped section on a first side face facing toward the optoelectronic part.

19 Claims, 8 Drawing Sheets

(51) Int. Cl.
*G02B 19/00* (2006.01)
*H01L 33/48* (2010.01)

(52) U.S. Cl.
CPC ........ *G02B 19/0061* (2013.01); *H01L 33/486* (2013.01); *H01L 33/58* (2013.01)

(56) References Cited

U.S. PATENT DOCUMENTS

| | | |
|---|---|---|
| 8,835,968 B2 | 9/2014 | Ha et al. |
| 9,557,035 B2 | 1/2017 | Saito |
| 11,165,004 B2* | 11/2021 | Jäger ............... G02B 19/0061 |
| 2006/0139575 A1 | 6/2006 | Alasaarela et al. |
| 2008/0030974 A1 | 2/2008 | Abu-Ageel |
| 2008/0054281 A1 | 3/2008 | Narendran et al. |
| 2008/0315227 A1* | 12/2008 | Bogner ............... H01L 33/64 257/E33.071 |
| 2010/0213480 A1 | 8/2010 | Jung et al. |
| 2014/0117391 A1 | 5/2014 | Ha et al. |
| 2015/0055348 A1 | 2/2015 | Ha et al. |
| 2015/0221835 A1 | 8/2015 | Tischler et al. |
| 2015/0345748 A1 | 12/2015 | Saito |
| 2016/0005931 A1 | 1/2016 | Lee et al. |
| 2017/0331015 A1 | 11/2017 | Hirmer et al. |
| 2019/0250486 A1 | 8/2019 | Butterworth |

FOREIGN PATENT DOCUMENTS

| | | |
|---|---|---|
| EP | 1467417 A2 | 10/2004 |
| JP | 2008016647 A | 1/2008 |
| JP | 2011040196 A | 2/2011 |
| JP | 2015213025 A | 11/2015 |
| JP | 2015225849 A | 12/2015 |
| JP | 2017050416 A | 3/2017 |
| KR | 1020050120695 A | 12/2005 |
| KR | 20090119248 A | 11/2009 |
| KR | 20120114615 A | 10/2012 |
| KR | 20150023162 A | 3/2015 |
| WO | 2006010790 A2 | 2/2006 |
| WO | 2011024641 A1 | 3/2011 |

* cited by examiner

COMPONENT WITH AN OPTOELECTRONIC PART

CROSS-REFERENCE TO RELATED APPLICATIONS

This is a divisional application of U.S. application Ser. No. 16/349,243, entitled "Component with an Optoelectronic Part," which was filed on May 10, 2019, which is a national phase filing under section 371 of PCT/EP2017/080227, filed Nov. 23, 2017, which claims the priority of German patent application 102016122770.6, filed Nov. 25, 2016, all of which is incorporated herein by reference in its entirety.

TECHNICAL FIELD

The invention relates to a component having an optoelectronic part and a method for producing a component having an optoelectronic part.

BACKGROUND

U.S. Pat. No. 8,835,968 B2 discloses a component having a carrier and an optoelectronic part. The part is configured in order to generate electromagnetic radiation. The part is arranged on the carrier. Furthermore, arranged on the carrier is a lens housing, which comprises a part space on a lower side. The part is arranged in the part space. A first side face of the lens housing, which is arranged over the part, has a pyramidal shape. By the lens housing, the radiation is directed with the aid of total internal reflection (TIR) on the lens housing.

SUMMARY

Embodiments provide an improved component and an improved method for producing a component.

In various embodiments a component having at least one optoelectronic part is proposed, wherein the part is configured as an electromagnetic radiation source, having a carrier, wherein the part is arranged on the carrier, having a frame, wherein the frame is arranged on the carrier and encloses a part space, wherein the part is arranged in the part space, having a lens, wherein the lens is arranged on the frame and at least partially covers an opening of the part space, wherein the reflector is configured in order to direct radiation of the part onto the lens, wherein the lens is configured in order to direct the electromagnetic radiation of the part, wherein the lens comprises at least a partial pyramidal shape on a first side face facing toward the part, wherein the partial pyramidal shape of the lens comprises lateral faces, wherein the lateral faces meet one another via edges. In this case, the lateral faces may, in particular, be configured at least as trapezoidal faces.

The partial pyramidal shape may have a triangular, quadrilateral or polygonal base face. Furthermore, in accordance with the shape of the base face, three, four or more lateral faces are provided.

One advantage of the described component is that the component can be produced simply and economically. Furthermore, the structure of the component can be configured more flexibly and more individually, since the reflector is formed independently of the lens. The component can therefore be optimized both in relation to the materials used for the reflector and in relation to the materials used for the lens. Furthermore, the component can be optimized mutually independently in relation to the shape of the reflector and to the shape of the lens. Furthermore, a low component height can be achieved with the aid of the proposed component. The proposed component reduces reflection losses on the lens for applications which, in particular, comprise a rotationally nonsymmetrical radiation surface. This is advantageous, for example, in the case of square, rectangular or polygonal radiation surfaces. In comparison with a TIR lens, the lens used is simpler to manufacture.

For example, cameras for recording images or films have optical systems with a rectangular sensor geometry for recording the image. The sensors in this case comprise a rectangular recording field with side ratios of, for example, 4 to 3 or 16 to 9. With the proposed component, the image to be recorded can be illuminated efficiently in the rectangular area.

In one embodiment, the first side face is configured in the shape of a pyramidal frustum, wherein the pyramidal frustum comprises trapezoidal lateral faces and a top face. With this shape of the first side face, a component with a particularly short height can be obtained, the light guiding being good.

In one embodiment of the first side face as a pyramidal frustum, the top face is configured as a plane face. In this way, the component can be produced simply and good light guiding properties are obtained.

In one embodiment, the top face is configured as a curved face, in particular as a convex face. In this way, an improvement of the light guiding can be achieved, with at the same time a low component height.

In one embodiment, the first side face of the lens comprises a pyramidal shape. With this embodiment, good light guiding is achieved.

In one embodiment, at least one of the lateral faces, in particular all lateral faces, is configured as a curved face at least in a subsection of one direction. In this way, a further improvement of the light guiding can be achieved.

In one embodiment, the reflector comprises an inner frame face, wherein the inner frame face laterally peripherally bounds the part space, and wherein at least the inner frame face is configured as a reflection face the radiation of the part. Losses in the emission power are thereby reduced.

In one embodiment, the inner frame face comprises, in cross section perpendicular to a surface of the carrier, a face inclined outward in a direction toward the lens. In this way, good emission is obtained with a simple shape of the reflector.

In one embodiment, the inner frame face comprises, in cross section perpendicular to a surface of the carrier, a greater curvature in an upper section, which faces toward the lens, than in a lower section which faces toward the carrier. With this shape of the reflector, improved emission is made possible with a low component height.

In one embodiment, the inner frame face comprises an S-shape in cross section perpendicular to a surface of the carrier. With this shape of the reflector, a farther improvement of the emission is made possible with a low component height.

In one embodiment, the inner frame face comprises, in cross section perpendicular to a surface of the carrier, a concave shape at least in one section.

In one embodiment, the inner frame face comprises, in cross section perpendicular to a surface of the carrier, a straight section in a first section starting from the carrier, wherein the straight section is essentially oriented perpendicularly to an upper side of the carrier. In this way, the reflector comprises a simple shape.

In one embodiment, the straight section extends to above an upper side of the part.

The simple shape is therefore restricted to a low-radiation region.

In one embodiment, the inner frame face comprises, in a second section which is further away from the carrier than the first section is, a face inclined outward in the direction of the lens.

In one embodiment, the inner frame face comprises, in a second section which is further away from the carrier than the first section is, at least in a subsection an S-shape.

In one embodiment, the frame is formed from four frame sections, wherein in each case two frame sections meet one another in a corner region, wherein the first side face comprises at least the partial pyramidal shape with lateral faces and with edges between the lateral faces, wherein as many edges are provided between the lateral faces as the frame comprises corner regions, and wherein in each case an edge is oriented in the direction of a corner region of the frame. In this way, a uniform distribution of the electromagnetic radiation is achieved.

In one embodiment, the lens extends into the part space by up to one third of a distance between an upper side of the part and an upper end of the part space.

In one embodiment, the lens extends into the part space by more than one third of a distance between an upper side of the part and an upper end of the part space, wherein the lens extends into the part space by up to one half of a distance between an upper side of the part and an upper end of the part space.

In one embodiment, the lens extends into the part space by more than one half of a distance between an upper side of the part and an upper end of the part space, wherein the lens extends into the part space by up to three-fourths of a distance between an upper side of the part and an upper end of the part space.

With this embodiment, a desired distribution of the electromagnetic radiation is obtained with a low component height.

In one embodiment, the partial pyramidal shape is configured in such a way that a base face of the partial pyramidal shape of the first side face of the lens covers at least 50%, in particular 70% or more, of the opening of the frame. The more area of the opening is covered by the first side face, the better the radiation guiding by the lens is.

In one embodiment, the lens comprises a second side face, wherein the second side face is formed opposite to the first side face, wherein the second side face comprises guiding structures for guiding the radiation. With the aid of the guiding structures, a desired guiding of the radiation can be improved.

In further embodiments a method is proposed for producing a component having at least one optoelectronic part, wherein the part is configured as an electromagnetic radiation source, having a carrier, wherein the part is arranged on the carrier, a frame is arranged on the carrier, wherein the frame encloses a part space, wherein the part is arranged in the part space, wherein a lens is arranged on the frame and at least partially covers an opening of the part space, wherein the reflector is configured in order to direct the radiation of the part onto the lens, wherein the lens is configured in order to direct the electromagnetic radiation of the part, wherein the lens comprises at least a partial pyramidal shape on a first side face facing toward the part, wherein the partial pyramidal shape of the lens comprises lateral faces, wherein the lateral faces meet one another via edges. In this case, the lateral faces may be configured at least as trapezoidal faces.

One advantage of the described method is that the component can be produced simply and economically. Furthermore, the method enables the structure of the component to be configured more flexibly and more individually, since the reflector is formed independently of the lens. The component can therefore be optimized both in relation to the materials used for the reflector and in relation to the materials used for the lens. Furthermore, the component can be optimized mutually independently in relation to the shape of the reflector and to the shape of the lens.

BRIEF DESCRIPTION OF THE DRAWINGS

The above described properties, features and advantages of this invention, as well as the way in which they are achieved, will become more clearly and readily comprehensible in connection with the following description of the exemplary embodiments, which will be explained in more detail in connection with the drawings, in which.

DETAILED DESCRIPTION OF ILLUSTRATIVE EMBODIMENTS

Figure 1:
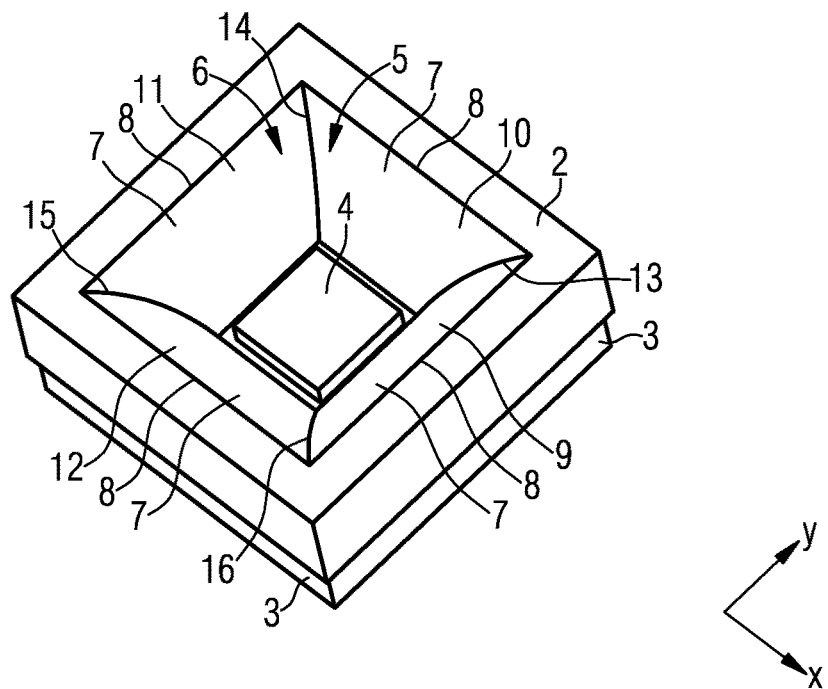
FIG. 1 shows a perspective representation of a carrier with a reflector and a part.

FIG. 1 shows in a schematic perspective representation a carrier 3, which is configured in the shape of a square plate. The carrier is arranged in an x-y plane. A peripheral frame 2 is arranged on the carrier 3. The frame 2 encloses a part space 5 on four sides. In the part space 5, a part 4 is arranged on the carrier 3. The part 4 is configured as an optoelectronic part which can emit electromagnetic radiation, in particular visible light. For example, the optoelectronic part 4 is configured as a laser diode or as a light-emitting diode. The frame 2 encloses the part space 5, the frame 2 having a frame opening 6 which is arranged opposite to the carrier 3. The frame 2 is, for example, formed from a molding material, for example, epoxy resin or plastic, metal, in particular aluminum.

The optoelectronic part 4 may be configured as a semiconductor chip. In the embodiment represented, the part 4 is a square shape. The frame 2 comprises an inner frame face 7, which laterally bounds the part space 5 peripherally. At least the inner frame face 7 is configured as a reflector with a reflection face for the radiation of the part. Depending on the embodiment selected, the entire frame 2 may be configured as a reflector. The reflector may, for example, be embodied by a metallic face, in particular a polished metallic face. The inner frame face 7 extends from the carrier 3 upward to an upper region 8 of frame 2. The upper region 8 is arranged opposite to the carrier 3 on the frame 2.

In the exemplary embodiment represented, the frame 2 comprises four frame sections 9, 10, 11, 12. The frame sections are respectively configured as straight frame sections 9, 10, 11, 12 and merge into one another in corner regions 13, 14, 15, 16. The frame sections are arranged parallel to an x axis or parallel to a y axis, the x axis and the y axis being perpendicular to one another. In the exemplary embodiment represented, the frame 2 comprises four corner regions 13, 14, 15, 16, in which in each case two frame sections 9, 10, 11, 12 meet one another at an angle of 90°. Depending on the embodiment selected, the frame 2 may also comprise only three frame sections or more than four frame sections. Furthermore, the frame sections may also meet one another, or merge into one another, at angles other than 90° in the respective corner regions. Furthermore, the corner regions may also be rounded.

The inner frame faces 7 of the frame sections 9, 10, 11, 12 of the frame 2, which comprise a reflection face and represent the reflector, essentially comprise an S-shape in cross section perpendicular to the surface of the carrier 1. The reflection faces of the reflector are referred to below as inner frame faces 7 of the frame sections.

Figure 2:
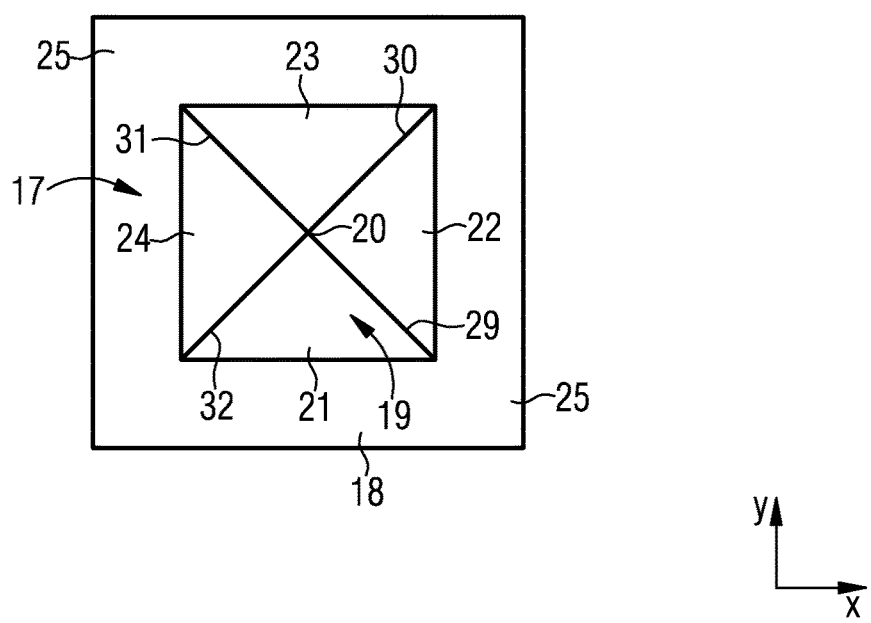
FIG. 2 shows a plan view of a lens.

FIG. 2 shows in a schematic representation a plan view in the y-x plane of a first side face 17 of a lens 18. The first side face 17 of the lens 18 has a pyramidal shape. In the example represented, the pyramid is configured as a square pyramid with a square base face 19. Furthermore, the pyramid comprises an apex 20 which is arranged at a predetermined height from the base face. The square pyramid comprises four lateral faces 21, 22, 23, 24, which are configured triangularly and converge at the apex 20. Edges 29, 30, 31, 32 are provided, which separate the lateral faces 21, 22, 23, 24 of the first side face 17 and are oriented starting from the apex 20 in the direction of the corners of the base face. Since the base face of the pyramidal shape represents a square, the four lateral faces 21, 22, 23, 24 are configured identically. The first side face 17 of the lens 18 is enclosed by a peripheral edge 25. The lens 18 therefore comprises a first side face 17 with a pyramidal shape, which is enclosed by an edge 25. The lens 18 is made of a material which is transparent for the radiation of the part 4, with a refractive index which is greater than that of air. For example, the lens 18 may be made of glass or silicone or epoxy resin or plastic. The radiation of the part 4 may comprise visible light and/or infrared light.

The term lens denotes an optically transparent element which causes radiation guiding and radiation directing by refraction and/or reflection, in which case the optical element may comprise an imaging function although it does not need to. The term lens is therefore not restricted to optically imaging elements.

Figure 3:
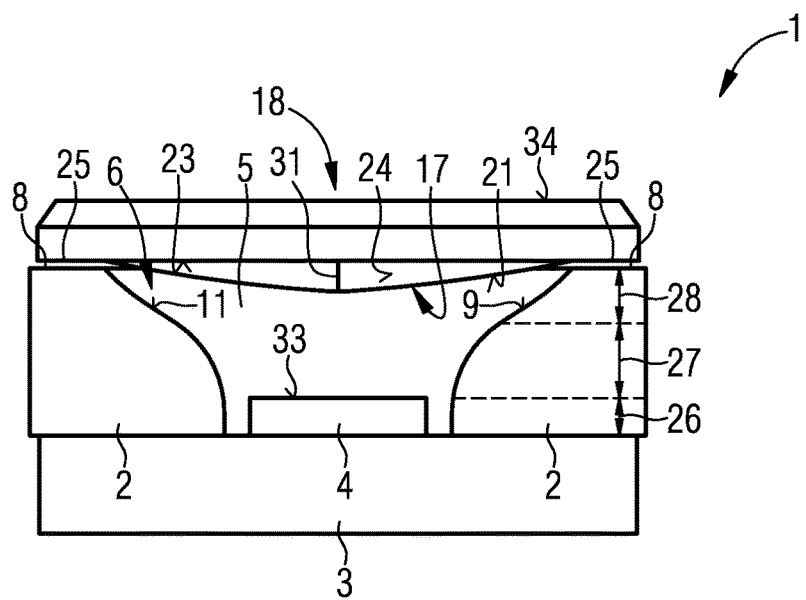
FIG. 3 shows a cross section through a component with a carrier, reflector, part and lens.

FIG. 3 shows a schematic cross section in an x-z plane through a component 1, which comprises a carrier 3, a frame 2 and a part 4 according to FIG. 1, the lens 18 of FIG. 2 being placed onto the opening 6 of the part space 5. In this case, the first side face 17 with the pyramidal shape protrudes into the part space 5. The lens 18 is placed with the edge 25 onto the upper region 8 of the frame 2. The cross section represented passes through the first and third lateral faces 21, 23 of the pyramidal shape of the first side face 17. Furthermore, the cross section extends through the first and third frame sections 9, 11. The apex 20 of the pyramidal shape protrudes into the part space 5 by a predetermined height H starting from the edge 25. The inner frame faces 7 of the frame sections 9, 10, 11, 12, which form the reflector, are configured identically in the present example.

In the embodiment represented, the inner frame faces 7 of the frame sections, which comprise the reflection faces, in the cross section represented comprise a face inclined outward starting from the carrier 3 in the direction of the lens 18. In this case, the angle of inclination of the frame faces 7 may be configured in sections differently in relation to the plane of the upper side of the carrier 3. For example, the frame face 7 may be oriented perpendicularly to the upper side of the carrier 3 in a lower first section 26. In a subsequent second section 27, the frame face 7 has a radius of curvature and is arranged inclined outward laterally away from the part 4 and has a convex shape. In a third section, which follows on from the second section 27 and is extended as far as the upper region 8 of the frame 2, the frame face 7 has a concave shape. Depending on the embodiment selected, the frame faces 7 of the frame sections may also be configured as faces inclined outward.

The lens 18 comprises a first side face 17 with a low pyramidal shape, a distance between the pyramid apex 20 and an upper side 33 of the part 4 being less than one third of the height of the part space 5. The height of the part space 5 denotes the distance between the upper side of the carrier 3 and the upper side 8 of the frame 2. Depending on the embodiment selected, the lens 18 may comprise a first side face 17 with a larger height. The apex 20 may therefore protrude more deeply into the part space 5 into a region which is located between one third and one half of the distance between the upper side 33 of the part 4 and the upper side 8 of the frame 2.

Depending on the embodiment selected, the lens 18 may comprise further optical guiding structures such as recesses, lens or microprisms on a second side face 34, which is arranged opposite to the first side face 17, in order to achieve additional beam shaping of the electromagnetic radiation of the part 4.

In another embodiment, the first side face 17 may have a pyramidal shape with an even greater height and protrude into the part space 5 by more than one half, in particular by up to three-fourths, of the distance between the upper side 33 of the part 4 and the upper side 8 of the frame 2. Furthermore, depending on the embodiment selected, the pyramid apex 20 may also be arranged even closer to the upper side 33 of the part 4, and the distance between the apex 20 and the part 4 may be less than one third of the distance between the upper side of the part 5 and the upper side 8 of the frame 2.

Figure 4:
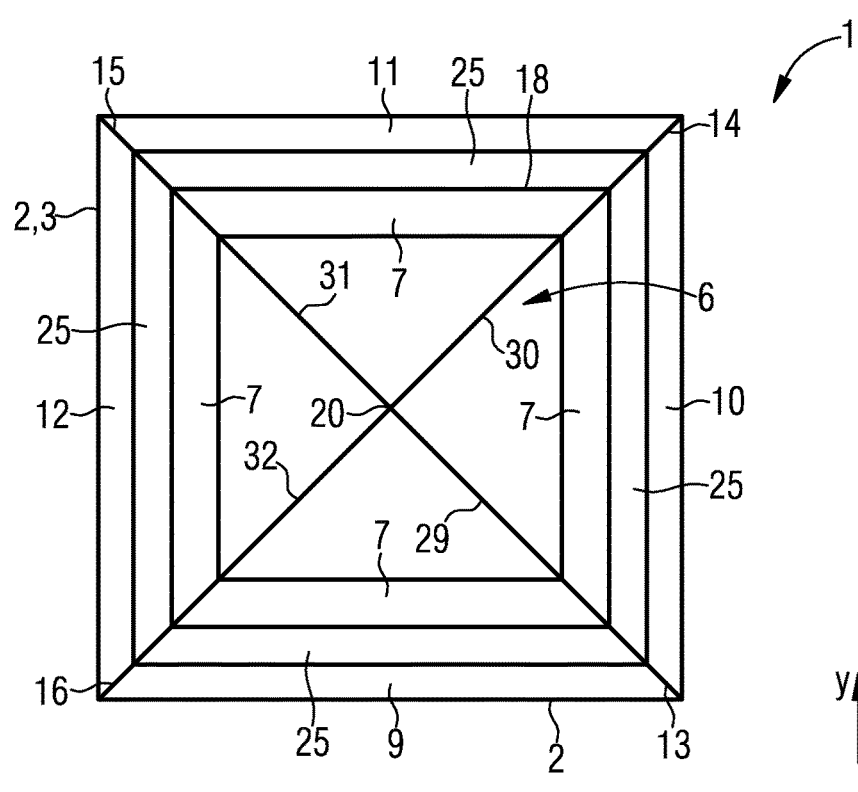
FIG. 4 shows a schematic view from above of the component 1 of FIG. 3

FIG. 4 shows a schematic view from above of the component 1 of FIG. 3, the lens 18 being represented transparently. The lens 18 is oriented in such a way that corners of the base face 19 of the pyramid are arranged over corner regions 13, 14, 15, 16 of the frame 2. The edges 29, 30, 31, 32, which separate the lateral faces 21, 22, 23, 24 of the first side face 17, are therefore aligned in the direction of the corner regions 13, 14, 15, 16 of the frame 7. The base face 19 of the pyramid is preferably configured to be so large that at least 50%, in particular 75% or more of the area of the opening 6 is covered with the base face 19. For example, the base face 19 may cover more than 90%, in particular more than 95%, of the area of the opening 6. In this way, efficient radiation guiding is achieved.

In the configuration of a frame 2 with three corner regions, the pyramidal shape also comprises only three lateral faces and three edges. In this embodiment as well, the edges and therefore the corners of the base face 19 of the pyramid are oriented in the direction of the corner regions of the frame. If the frame comprises more than four corner regions, then the lens 18 also has a pyramidal shape with a base face 19 with more than four corners, and therefore with more than four lateral faces and more than four edges. In this embodiment as well, in each case a corner of the base face of the pyramid and therefore an edge is oriented in the direction of a corner region of the frame 2.

Figure 5:
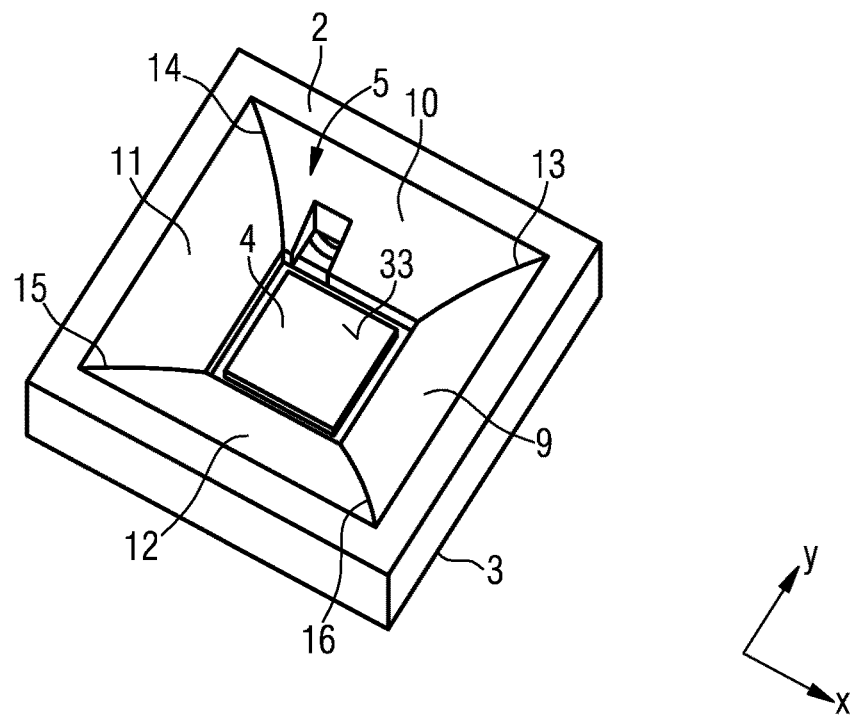
FIG. 5 shows a perspective representation of a carrier with a further reflector and a part.

FIG. 5 shows a perspective representation of another embodiment of a carrier 3 with a frame 2 and a part 4. The frame 2 is formed from four frame sections 9, 10, 11, 12 and is constructed essentially according to FIG. 1. However, the shape of the frame faces 7 of the frame sections 9, 10, 11, 12 differs from the embodiment of FIG. 1. Furthermore, the first and third frame sections 9, 11 are configured to be longer than the second and fourth frame sections 10, 12. The first and third frame sections 9, 11 are configured with equal length. The second and fourth frame sections 10, 12 are configured with equal length. The frame 7 with the four frame sections therefore delimits a rectangular part space 5.

Figure 6:
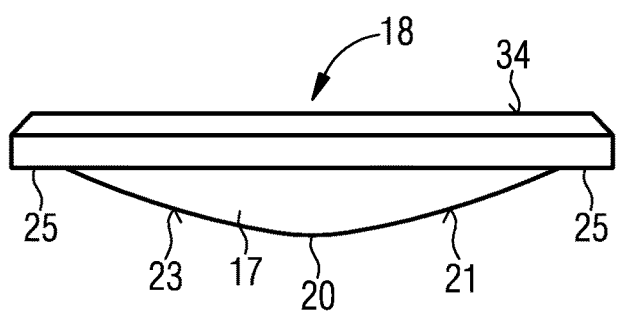
FIG. 6 shows a cross section through a lens.

FIG. 6 shows in a cross section another embodiment of a lens 18, which comprises as a first side face 17 a pyramidal shape according to the lens 18 of FIG. 2, although the apex 20 is further away from the base face, or the frame 25, than in FIG. 2. Furthermore, the lens 18 comprises a rectangular base face.

Figure 7:
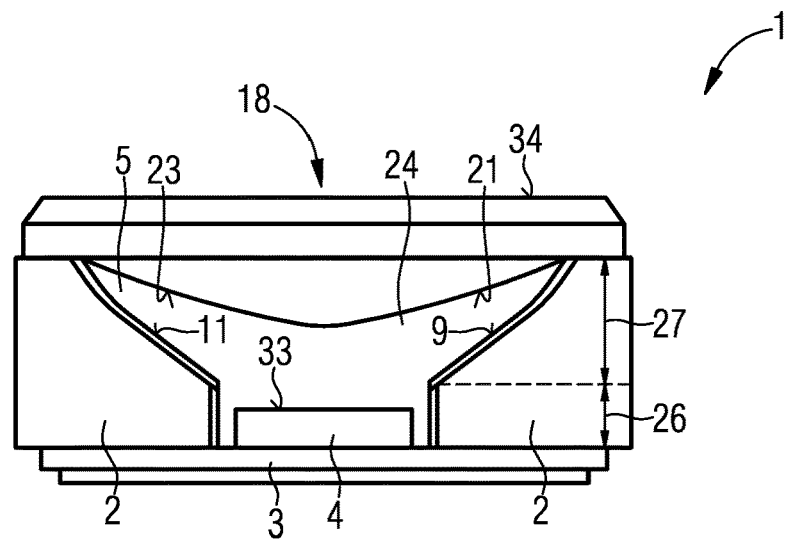
FIG. 7 shows a cross section through a further component with a lens.

FIG. 7 shows a component 1 which comprises the frame 2 with the carrier 3 and the part 4 according to FIG. 5 and the lens 18 according to FIG. 6. The lens 18 protrudes with the first side face 17 and with the pyramid apex 20 closer to the upper side 33 of the part 4. Furthermore, the first and third frame sections 9, 11, represented in cross section, have a different shape than the frame sections of the embodiment of FIGS. 1 and 3. In the embodiment represented, the frame face 7 of the frame sections 9, 11 is divided into a first and a second section 26, 27. The first section 26 meets the upper side of the carrier 3 and is configured perpendicularly. The first section 26 extends to above the upper side 33 of the part 4. The second section 27 of the frame face 7 extends from the first section 26 to the upper side 8 of the frame 2. The second section 27 is configured as a curved concave face.

Depending on the embodiment selected, the lens 18 may comprise optical guiding structures such as recesses, lenses or microprisms on a second side face 34, which is arranged opposite to the first side face 17, in order to achieve additional beam shaping of the electromagnetic radiation of the part 4.

Figure 8:
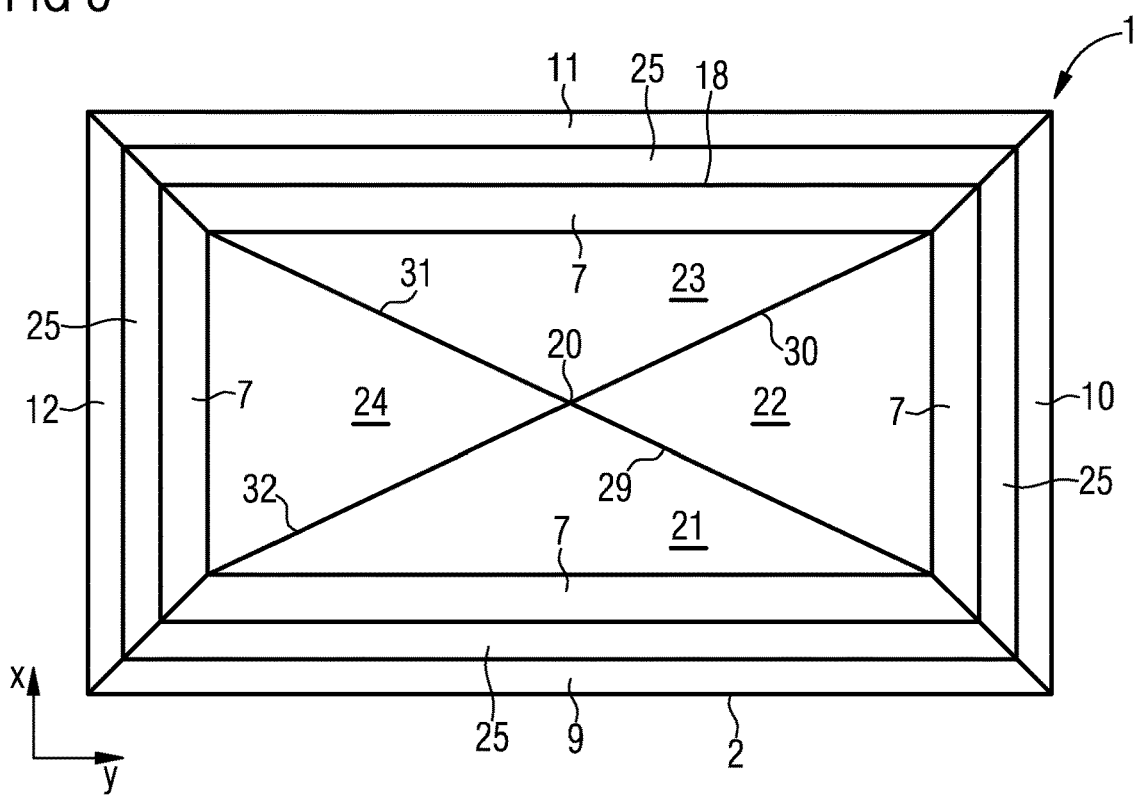
FIG. 8 shows a schematic plan view of the component of FIG. 7.

FIG. 8 shows a schematic plan view of the component 1 of FIG. 7, the rectangular lens 18 and the frame 7 with the frame sections 9, 10, 11, 12 being represented. The first and third lateral faces 21, 23 are of equal size. The second and fourth lateral faces 22, 24 are of equal size.

Figure 9:
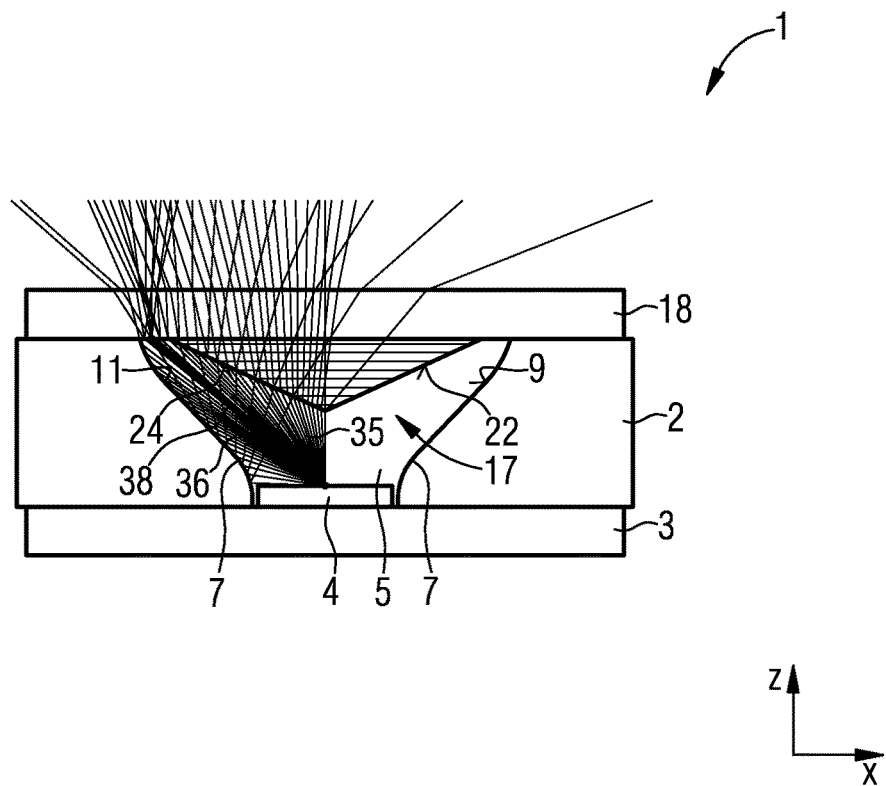
FIG. 9 shows a cross section in the x direction through the component of FIG. 7.

FIG. 9 shows a cross section in the z-x plane through the component 1 of FIGS. 7 and 8. It can be seen in this case that the radiation field, which is emitted from the upper side 33 of the part 4, can be divided into two regions 35, 36, the two regions 35, 36 being represented as separated by an imaginary separating line 38. In the first region 35, the rays are emitted directly into the first side face 17 of the lens 18. In the second region 36, which is formed between the first region 35 and the frame 2, the electromagnetic rays are first emitted, starting from the upper side 33 of the part 4, in the direction of the inner frame face 7, are reflected by the inner frame face 7 and are directed in the direction of the first lateral face 17 of the lens 18.

Figure 10:
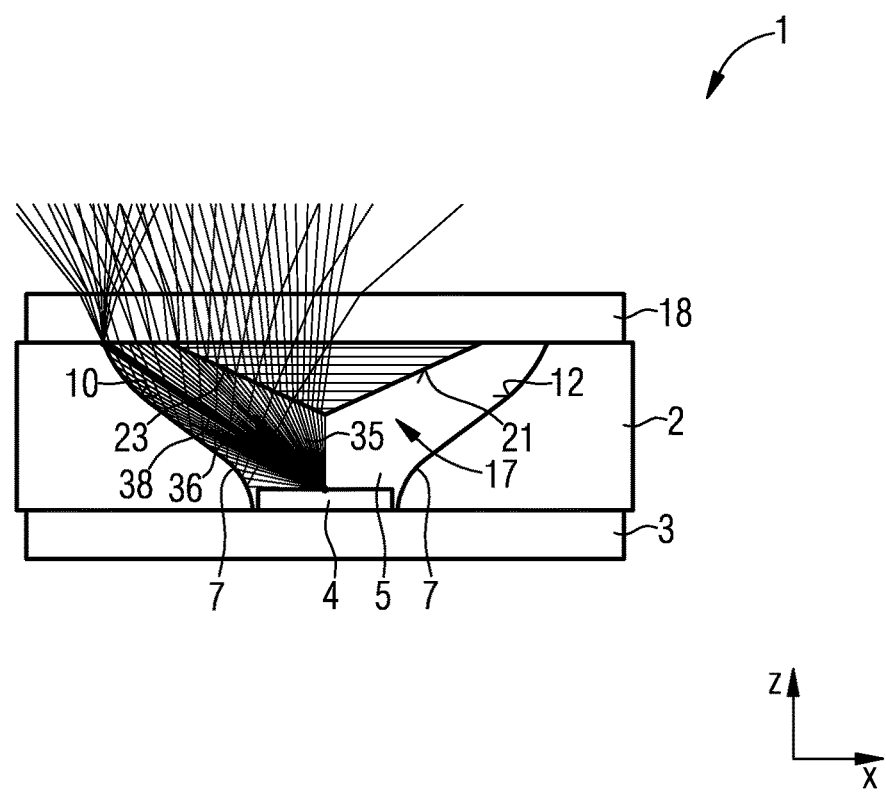
FIG. 10 shows a cross section in the y direction through the component of FIG. 7.

FIG. 10 shows a cross section through the component 1 of FIGS. 7 and 8 in the z-y plane. The part space 5 comprises a rectangular face and is configured longer in the y direction than in the x direction. In a similar way, the angle of inclination of the lateral faces of the pyramidal shape of the first lateral face 17 of the lens 18 is smaller for the first and third lateral faces 21, 23 than for the second and fourth lateral faces 22, 24. In this case as well, the radiation field which is emitted from the upper side 33 of the part 4 can be divided into two regions 35, 36, the two regions 35, 36 being represented as separated by an imaginary separating line 38.

Figure 11:
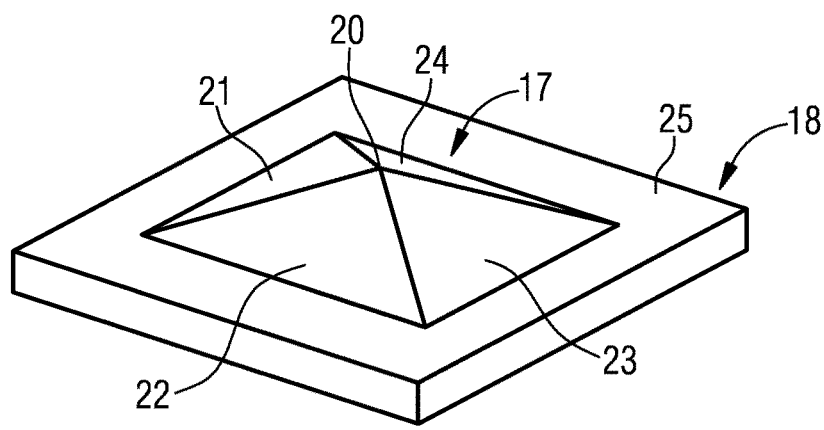
FIG. 11 shows a perspective representation of the lens of FIG. 6.

FIG. 11 shows in a perspective representation a plan view of the first lateral face 17 of the lens 18 of FIG. 6. The first lateral face 17 has a pyramidal shape with a rectangular base face 19. The first and third lateral faces 21, 23 and the second and fourth lateral faces 22, 24 are respectively configured identically. However, the shapes and areas of the first lateral face 21 and of the second lateral face 22 differ.

Figure 12:
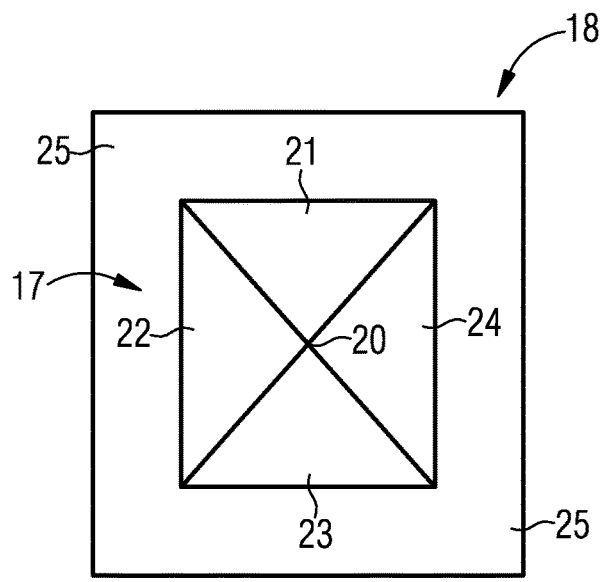
FIG. 12 shows a plan view of the lens of FIG. 11.

FIG. 12 shows a plan view of the first side face of the lens 18 of FIG. 10.

Figure 13:
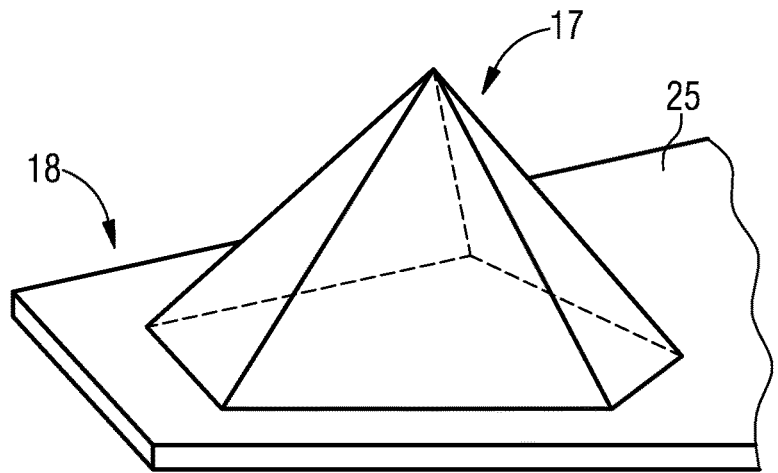
FIG. 13 shows the schematic representation of a further embodiment of a lens.

Depending on the embodiment selected, the first side face 17 of the lens 18 of FIG. 2 or FIG. 6 may also have a pyramidal shape with a base face 20 with five corners and therefore with five lateral faces, as is represented in FIG. 13.

Figure 14:
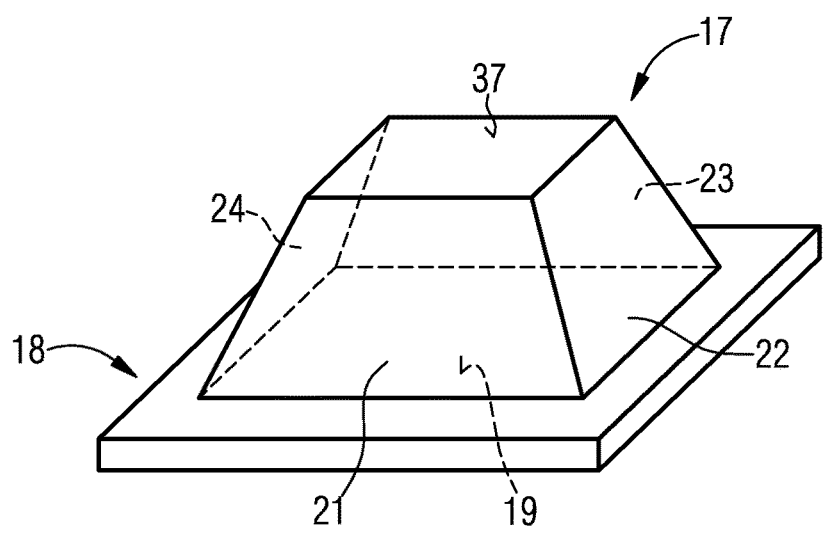
FIG. 14 shows the schematic representation of a lens with a side face in the shape of a pyramidal frustum.
Figure 14:
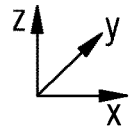

Furthermore, the first side face 17 of the lens 18 of FIG. 2 or of FIG. 6 may also be configured in the shape of a partial pyramid, particularly in the shape of a pyramidal frustum, as is represented in FIG. 14. The pyramidal frustum comprises a rectangular base face 19. In this embodiment, the first side face 17 comprises four lateral faces 21, 22, 23, 24 and one top face 37. The top face is likewise configured rectangularly. The lateral faces 21, 22, 23, 24 are configured as trapezoidal faces in this embodiment. The top face 37 is arranged parallel to the base face 19. In the embodiment represented, the base face 19 comprises four corners, and the pyramidal shape therefore also comprises 4 four edges 29, 30, 31, 32. The base face 19 of the pyramidal frustum is preferably configured to be so large that at least 50%, in particular 75% or more of the area of the opening 6 is covered with the base face 19. For example, the base face 19 may cover more than 90%, in particular more than 95%, of the area of the opening 6. In this way, efficient radiation guiding is achieved.

Depending on the embodiment selected, a lens 18 with a first side face 17 which comprises a pyramidal frustum according to FIG. 14 may also be provided, but with the base face 19 being configured squarely. In this embodiment, the top face 37 is also configured squarely.

Furthermore, depending on the embodiment selected, in the configuration of the first side face 17 of the lens 18 in the shape of a pyramidal frustum, both the top face 37 and the lateral faces 21, 22, 23, 24 may have a rounded shape, in particular a concave or convex shape.

Figure 15:
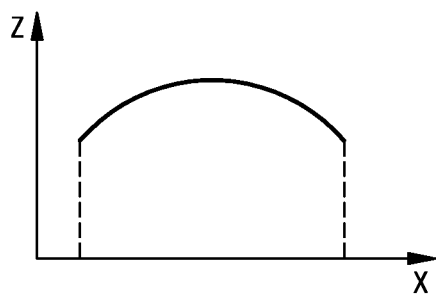
FIG. 15 shows a cross section in the x direction through the top face of a pyramidal frustum.

FIG. 15 shows a cross section through the top face 37 of the first side face 17 of the lens 18 of FIG. 14, the cross section being arranged in a z-x plane. The top face 37 is arranged in a y-x plane. In this selected embodiment, however, the top face 37 comprises bending in the z axis along the y axis.

Figure 16:
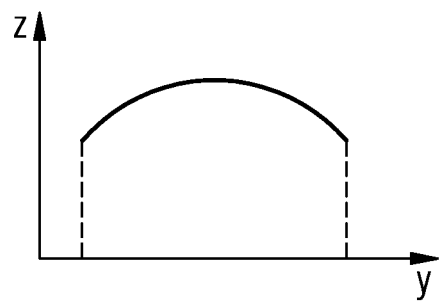
FIG. 16 shows a cross section in the y direction through the top face of the pyramidal frustum.

FIG. 16 shows a cross section through the top face of FIG. 14 in the z-y plane. The top face 37 also comprises a curvature in the direction of the z axis along the y axis. Depending on the embodiment selected, the radii of curvature of the top face 37 along the x axis and along the y axis may be of equal size or different sizes.

In a similar way, the lateral faces both of a first side face 17 in the shape of a pyramidal frustum or of a first side face 17 the shape of a pyramid may be configured as convex or concave faces and comprise a curvature.

Figure 17:
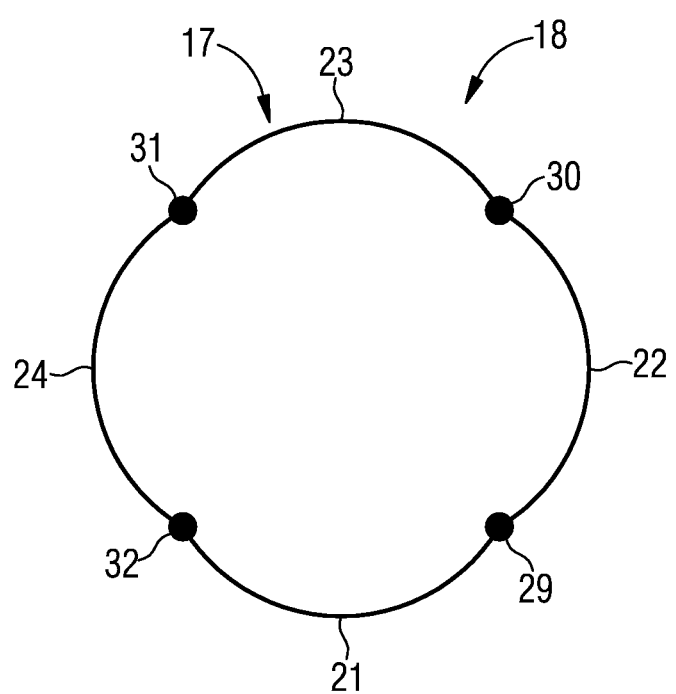
FIG. 17 shows a cross section through a first side face of a lens with curved lateral faces.

FIG. 17 shows a cross section through lateral faces 21, 22, 23, 24 of a pyramidal frustum of FIG. 14 in a y-x plane which is arranged parallel to the base face 19. In this case, it can be seen that the lateral faces 21, 22, 23, 24 respectively comprise a curvature, that is to say a curved surface outward in the x-y plane.

The first side face 17 of a lens 18 both in the shape of a pyramidal frustum and in the shape of a pyramid may therefore comprise faces rounded both in planes parallel to the base face 19 and in planes perpendicular to the base face 19. The curvature of the side faces, in particular the convex curvature, should be dimensioned at most to be so large that the light rays from each emission region of the part can directly strike a transition region between the side face and the edge of the first side face.

An angle of inclination of a plane lateral face 21, 22, 23, 24 may be between 1° and 45°. For example, the lateral faces may be oriented at an angle of 15° with respect to the base face 19. A part may comprise an upper side 33 which is, for example, between 500 μm and 1 mm long and wide. The part may have a height which is in the region of 1.6 mm. The reflector may have an overall height which, for example, is in the region of 0.8 mm.

The rays reflected by the first side face 17 of a lens 18 are reflected externally onto the reflector and do not leave the component without deviation. Furthermore, the electromagnetic radiation emitted by the part directly strikes the reflector, that is to say the reflective inner frame face 7. The electromagnetic rays striking the inner frame face 7 are reflected in the direction of the first side face 17 and refracted by the first side face 17 uniformly in the direction of the optical axis.

Because of the frustopyramidal shape or the pyramidal shape, the reflector can be configured to be flat, that is to say the inner frame face 7 may have a relatively small height. In this way, a very flat reflector design is possible. Furthermore, high beam strengths and narrow-angle emission with a square or rectangular emission geometry can be achieved. Furthermore, because of the proposed components, an improved efficiency is achieved by more effective use of the rays reflected by the lens structure. The proportion of light not deviated into the optical axis is thereby reduced.

What is claimed is:

1. A component comprising:
a carrier;
at least one optoelectronic part arranged on the carrier, the optoelectronic part configured to emit electromagnetic radiation;
a frame arranged on the carrier and enclosing a part space, wherein the optoelectronic part is arranged in the part space, and wherein the frame comprises a reflector; and
a lens arranged on the frame and at least partially covering an opening of the part space,
wherein the reflector is configured to direct the electromagnetic radiation onto the lens,
wherein the lens is configured to direct the electromagnetic radiation of the optoelectronic part,
wherein the lens comprises at least a partial pyramidal-shaped section on a first side face facing toward the optoelectronic part,
wherein the partial pyramidal-shaped section of the lens comprises lateral faces,
wherein the lateral faces meet one another via edges,
wherein the reflector is configured as an inner frame face of the frame,
wherein the inner frame face laterally peripherally bounds and encloses the part space,
wherein at least the inner frame face is configured as a reflection face for the electromagnetic radiation of the optoelectronic part,
wherein the inner frame face has, in a cross section perpendicular to a surface of the carrier, a straight section in a first section starting from the carrier,
wherein the straight section is essentially oriented perpendicularly to an upper side of the carrier,
wherein the inner frame face has, in a second section which is further away from the carrier than the first section is, at least in a subsection an S-shape in the cross section perpendicular to the surface of the carrier.

2. The component as claimed in claim 1, wherein the first side face is configured in a shape of a pyramidal frustum-shaped section, wherein the pyramidal frustum-shaped section comprises trapezoidal lateral faces and a top face, and/or wherein the top face is configured as a convex face.

3. The component as claimed in claim 1, wherein at least one of the lateral faces is configured as a curved face at least in a subsection of one direction and/or wherein the partial pyramidal-shaped section of the lens comprises edges, wherein the curved face is present in a cross section parallel to an edge of the partial pyramidal-shaped section.

4. The component as claimed in claim 3, wherein the curved face is present in a cross section through the lateral face parallel to an imaginary base face of the partial pyramidal-shaped section.

5. The component as claimed in claim 1, wherein the inner frame face comprises, in the cross section perpendicular to the surface of the carrier, a face inclined outward in a direction toward the lens.

6. The component as claimed in claim 1, wherein the inner frame face comprises, in the cross section perpendicular to the surface of the carrier, a greater curvature in an upper section, which faces toward the lens, than in a lower section which faces toward the carrier.

7. The component as claimed in claim 1, wherein the inner frame face comprises the S-shape in the cross section perpendicular to the surface of the carrier.

8. The component as claimed in claim 1, wherein the inner frame face comprises, in the cross section perpendicular to the surface of the carrier, a concave shape at least in one section.

9. The component as claimed in claim 1, wherein the straight section extends to above an upper side of the optoelectronic part.

10. The component as claimed in claim 9, wherein the inner frame face has, in the second section which is further away from the carrier than the first section is, a face inclined outward in a direction of the lens.

11. The component as claimed in claim 1, wherein the frame is formed from four frame sections, wherein in each case two frame sections meet one another in a corner region, wherein the first side face comprises at least the partial pyramidal-shaped section with lateral faces and with edges between the lateral faces, wherein as many edges and lateral faces are provided as the frame comprises corner regions, and wherein in each case an edge is oriented in a direction of the corner region of the frame.

12. The component as claimed in claim 1, wherein the lens extends into the part space by up to one third of a distance between an upper side of the optoelectronic part and an upper end of the part space.

13. The component as claimed in claim 1, wherein the lens extends into the part space by more than one half of a distance between an upper side of the optoelectronic part and an upper end of the part space, and wherein the lens extends into the part space by up to three-fourths of the distance between the upper side of the optoelectronic part and the upper end of the part space.

14. The component as claimed in claim 1, wherein a base face of the partial pyramidal shape of the first side face of the lens covers at least 50%, in particular 70% or more, of the opening of the frame.

15. The component as claimed in claim 1, wherein the lens comprises a second side face, wherein the second side face is formed opposite to the first side face, wherein the second side face comprises optical guiding structures for guiding the electromagnetic radiation.

16. A component comprising:
a carrier;
an optoelectronic part arranged on the carrier and configured to emit electromagnetic radiation;
a reflector arranged on the carrier, the reflector enclosing a part space in which the optoelectronic part is arranged; and
a lens being transparent for the electromagnetic radiation, the lens covering an opening,
wherein the lens comprises a partial pyramidal-shaped section, and is arranged such that the partial pyramidal-shaped section faces toward the optoelectronic part,
wherein the reflector is configured to direct radiation of the optoelectronic part onto the lens,
wherein the lens is configured to direct the electromagnetic radiation of the optoelectronic part,
wherein the partial pyramidal-shaped section of the lens comprises lateral faces,
wherein the lateral faces meet one another via edges,
wherein the reflector is an inner frame face of a frame,
wherein the inner frame face laterally peripherally bounds the part space,
wherein the inner frame face has, in cross section perpendicular to a surface of the carrier, a straight section in a first section starting from the carrier,
wherein the straight section is essentially oriented perpendicularly to an upper side of the carrier,
wherein the inner frame face has, in a second section which is further away from the carrier than the first section is, at least in a subsection an S-shape in a cross section perpendicular to the surface of the carrier,
wherein the frame has four frame sections,
wherein in each case two frame sections meet one another in a corner region,
wherein as many lens edges are provided as the frame comprises corner regions, and
wherein in each case an edge is oriented in a direction of the corner region of the frame.

17. A component comprising:
a carrier;
at least one optoelectronic part arranged on the carrier, the optoelectronic part configured to emit electromagnetic radiation;
a frame arranged on the carrier and enclosing a part space, wherein the optoelectronic part is arranged in the part space, and wherein the frame comprises a reflector; and
a lens arranged on the frame and at least partially covering an opening of the part space,
wherein the reflector is configured to direct the electromagnetic radiation onto the lens,
wherein the lens is configured to direct the electromagnetic radiation,
wherein the lens comprises at least a partial pyramidal-shaped section on a first side face facing toward the optoelectronic part,
wherein the partial pyramidal-shaped section comprises lateral faces,
wherein the lateral faces meet one another via edges,
wherein the reflector is configured as an inner frame face of the frame,
wherein the inner frame face laterally peripherally bounds and encloses the part space,
wherein at least the inner frame face is configured as a reflection face for the electromagnetic radiation of the optoelectronic part,
wherein the inner frame face has, in cross section perpendicular to a surface of the carrier, a straight section in a first section starting from the carrier, and
wherein the straight section is essentially oriented perpendicularly to an upper side of the carrier.

18. The component as claimed in claim 17, wherein the straight section extends to above an upper side of the optoelectronic part.

19. The component as claimed in claim 17, wherein the inner frame face has, in a second section which is further away from the carrier than the first section is, a face inclined outward in a direction of the lens.

* * * * *